US010804111B2

(12) United States Patent
Hashimoto et al.

(10) Patent No.: US 10,804,111 B2
(45) Date of Patent: Oct. 13, 2020

(54) METHOD FOR ROUGHENING SURFACE USING WET TREATMENT

(71) Applicant: NISSAN CHEMICAL INDUSTRIES, LTD., Tokyo (JP)

(72) Inventors: Keisuke Hashimoto, Toyama (JP); Yasunobu Someya, Toyama (JP); Takahiro Kishioka, Toyama (JP); Rikimaru Sakamoto, Toyama (JP)

(73) Assignee: NISSAN CHEMICAL INDUSTRIES, LTD., Tokyo (JP)

( * ) Notice: Subject to any disclaimer, the term of this patent is extended or adjusted under 35 U.S.C. 154(b) by 0 days.

(21) Appl. No.: 15/760,597

(22) PCT Filed: Sep. 15, 2016

(86) PCT No.: PCT/JP2016/077324
§ 371 (c)(1),
(2) Date: Mar. 15, 2018

(87) PCT Pub. No.: WO2017/047713
PCT Pub. Date: Mar. 23, 2017

(65) Prior Publication Data
US 2019/0092681 A1    Mar. 28, 2019

(30) Foreign Application Priority Data
Sep. 15, 2015    (JP) .................................. 2015-182144

(51) Int. Cl.
*H01L 21/306*    (2006.01)
*H01L 21/033*    (2006.01)
(Continued)

(52) U.S. Cl.
CPC ........ *H01L 21/30604* (2013.01); *C03C 15/00* (2013.01); *C03C 17/009* (2013.01);
(Continued)

(58) Field of Classification Search
None
See application file for complete search history.

(56) References Cited

U.S. PATENT DOCUMENTS

| | | | |
|---|---|---|---|
| 6,194,365 B1 * | 2/2001 | Lee .......................... | C03C 15/00 510/175 |
| 2011/0111173 A1 * | 5/2011 | Ogawa .................... | C23C 24/08 428/141 |

FOREIGN PATENT DOCUMENTS

| | | | |
|---|---|---|---|
| JP | 2006-107744 A | 4/2006 | |
| JP | 2007-201459 A | 8/2007 | |

(Continued)

OTHER PUBLICATIONS

Nov. 29, 2016 Written Opinion issued in International Patent Application No. PCT/JP2016/077324.
(Continued)

*Primary Examiner* — Jiong-Ping Lu
(74) *Attorney, Agent, or Firm* — Oliff PLC (57) ABSTRACT

A method for roughening a surface of a substrate, including: applying a composition containing inorganic particles and organic resin to the surface of the substrate and drying and curing the composition to form an organic resin layer; and etching the substrate by a solution containing hydrogen fluoride, hydrogen peroxide, or an acid, to roughen the surface. Preferably, the solution contains hydrogen fluoride and ammonium fluoride or hydrogen peroxide and ammonia, the resin layer contains a ratio of the particles to the resin of 5 to 50 parts by mass to 100 parts by mass, and the composition is a mixture of silica sol wherein silica is dispersed as the inorganic particles in organic solvent or titanium oxide sol wherein titanium oxide is dispersed, with a solution of the organic resin.

16 Claims, 3 Drawing Sheets

(51) Int. Cl.
    H01L 21/308    (2006.01)
    H01L 33/22     (2010.01)
    H01L 31/0236   (2006.01)
    H01L 51/52     (2006.01)
    C09D 161/34    (2006.01)
    C03C 17/34     (2006.01)
    C09K 13/06     (2006.01)
    C08F 212/32    (2006.01)
    C09K 13/08     (2006.01)
    C03C 17/00     (2006.01)
    C08G 14/06     (2006.01)
    C03C 15/00     (2006.01)
    C09D 7/40      (2018.01)
    C09D 125/02    (2006.01)
    C09D 161/18    (2006.01)
    C08K 3/22      (2006.01)
    H01L 31/0216   (2014.01)

(52) U.S. Cl.
    CPC ............ *C03C 17/34* (2013.01); *C08F 212/32* (2013.01); *C08G 14/06* (2013.01); *C09D 7/67* (2018.01); *C09D 7/68* (2018.01); *C09D 125/02* (2013.01); *C09D 161/18* (2013.01); *C09D 161/34* (2013.01); *C09K 13/06* (2013.01); *C09K 13/08* (2013.01); *H01L 21/0337* (2013.01); *H01L 21/3086* (2013.01); *H01L 31/02366* (2013.01); *H01L 33/22* (2013.01); *H01L 51/5275* (2013.01); *C03C 2217/445* (2013.01); *C03C 2217/478* (2013.01); *C03C 2218/33* (2013.01); *C08K 2003/2241* (2013.01); *H01L 31/02168* (2013.01); *H01L 51/5262* (2013.01); *H01L 2251/5369* (2013.01); *Y02E 10/549* (2013.01)

(56) References Cited

FOREIGN PATENT DOCUMENTS

| JP | 2009-216862 A |   | 9/2009 |           |
|----|---------------|---|--------|-----------|
| JP | 2010-074004 A |   | 4/2010 |           |
| JP | 2011-086762 A |   | 4/2011 |           |
| JP | 2011086762    | * | 4/2011 | H01L 21/3065 |

OTHER PUBLICATIONS

Nov. 29, 2016 International Search Report issued in International Patent Application No. PCT/JP2016/077324.

* cited by examiner

METHOD FOR ROUGHENING SURFACE USING WET TREATMENT

TECHNICAL FIELD

The present invention relates to a method for roughening a surface of a substrate. The method can be performed for a light extraction layer of an LED or the like, or a low-reflective glass of a solar cell.

BACKGROUND ART

In recent years, LED technology has been used. To improve the light extraction efficiency of a light extraction layer, technology for improving the light-emitting efficiency has been researched.

For example, a procedure for providing a light-scattering layer as the light extraction layer between a light-emitting layer and a substrate in an organic EL element has been proposed (see "fine particle dispersion layer" in Patent Document 1). As the light-scattering layer, a layer in which in a transparent resin, fine particles having a refractive index different from that of the resin are dispersed is used. Light emitted from a light-emitting portion is scattered by the light-scattering layer, to vary the advance direction into various directions. After multiple scattering, light incident within a total reflection angle of air interface is extracted. In the light-scattering layer, the advance direction of light is varied randomly. Therefore, it is preferable that the size distribution of the fine particles contained in the light-scattering layer be large, the arrangement of the fine particles be random, and the volume fraction of the fine particles be high. When the size distribution of the fine particles is small or the volume fraction of the fine particles is low, the scattering performance of the light-scattering layer is decreased. Thus, the purpose of the light-scattering layer cannot be sufficiently achieved. However, when the size distribution of the fine particles is too large, it is difficult that the fine particles are ideally arranged. When the size distribution of the fine particles is large and the volume fraction thereof is too high, the flatness of the light-scattering layer is significantly decreased. As a result, the flatness of the light-emitting portion that has a thin film structure may be deteriorated, to largely reduce the reliability of a light-emitting element.

A light extraction layer having a reflective layer and a three-dimensional diffraction layer that is formed on the reflective layer and includes fine particles having a variation coefficient of 10% or less and a matrix having a refractive index different from that of the fine particles has been proposed as a highly efficient light extraction layer (see Patent Document 2). In this aspect, the volume fraction of the fine particles is 50% or more based on the volume of the three-dimensional diffraction layer, the fine particles are arranged in the matrix to form first areas having short-distance periodicity, and the first areas are disposed adjacent to each other in random directions to form second areas.

In solar cells of which practical application proceeds, a technique in which a concave-convex structure such as a honeycomb structure for improvement of light-emitting efficiency is formed to decrease the reflectance is employed.

PRIOR ART DOCUMENTS

Patent Documents

Patent Document 1: Japanese Patent Application Publication No. 2006-107744 (JP 2006-107744 A)

Patent Document 2: Japanese Patent Application Publication No. 2009-216862 (JP 2009-216862 A)

SUMMARY OF THE INVENTION

Problem to be Solved by the Invention

The present invention provides a method for roughening a surface of a substrate. Specifically, a difference in wet etching rate between an inorganic substance and an organic substance is used to form a layer where the inorganic substance and the organic substance are mixed, on a substrate. More specifically, a roughened-surface forming layer is formed from the inorganic substance to be etched by a solution and the organic substance not to be etched by the solution, on the surface of the substrate. Subsequently, a portion where the inorganic substance exists is etched by the solution, to expose the surface of the substrate, and the substrate is also etched, to roughen the surface of the substrate. A method for roughening the surface of the substrate as described above, for example, a roughening method capable of forming fine irregularities on the substrate is provided.

Means for Solving the Problems

A first aspect of the present invention is a method for roughening a surface comprising: a first step of applying a composition (a3) containing inorganic particles (a1) and an organic resin (a2) to a surface of a substrate, and drying and curing the composition to form an organic resin layer (A) on the substrate; and a second step of etching the substrate on which the organic resin layer (A) is formed by a solution containing hydrogen fluoride, hydrogen peroxide, or an acid, to roughen the surface of the substrate.

A second aspect of the present invention is the method for roughening a surface according to the first aspect, wherein the etching is performed by using a solution containing hydrogen fluoride and an ammonium salt, hydrogen peroxide and ammonia, hydrogen peroxide and sulfuric acid, or phosphoric acid and nitric acid.

A third aspect of the present invention is the method for roughening a surface according to the first aspect, wherein the etching is performed by using a solution containing hydrogen fluoride and ammonium fluoride or hydrogen peroxide and ammonia.

A fourth aspect of the present invention is the method for roughening a surface according to any one of the first to third aspects, wherein the inorganic particles (a1) are metal oxide particles having an average particle diameter of 5 to 1,000 mm.

A fifth aspect of the present invention is the method for roughening a surface according to the first aspect, wherein the composition (a3) is a mixture of silica sol in which silica is dispersed as the inorganic particles (a1) in an organic solvent or titanium oxide sol in which titanium oxide is dispersed as the inorganic particles (a1) in an organic solvent with a solution of the organic resin (a2).

A sixth aspect of the present invention is the method for roughening a surface according to any one of the first to fifth aspects, wherein the organic resin layer (A) contains the inorganic particles (a1) and the organic resin (a2) at a ratio of the inorganic particles (a1) to the organic resin (a2) of 5 to 70 parts by mass to 100 parts by mass.

A seventh aspect of the present invention is the method for roughening a surface according to any one of the first to sixth aspects, wherein the organic resin (a2) is a resin having a repeating unit structure, the repeating unit structure being a structure having a functional group including a hydroxy group, a carboxyl group, an amino group, a glycidyl group, or a combination thereof.

An eighth aspect of the present invention is the method for roughening a surface according to any one of the first to seventh aspects, wherein the second step is a step of forming holes having an aspect ratio (height/diameter) of 0.1 to 20 on the surface of the substrate by etching.

A ninth aspect of the present invention is the method for roughening a surface according to any one of the first to eighth aspects, wherein the organic resin layer (A) has a thickness of 0.001 to 10 μm.

A tenth aspect of the present invention is the method for roughening a surface according to any one of the first to ninth aspects, wherein the first step further includes a pre-first step of applying a composition (b3) containing an organic resin (b2) to the surface of the substrate, and drying and curing the composition to form an organic resin layer (B) on the substrate before formation of the organic resin layer (A).

An eleventh aspect of the present invention is the method for roughening a surface according to the tenth aspect, wherein the organic resin (b2) is selected from the organic resin (a2) that is a resin having a repeating unit structure, the repeating unit structure being a structure having a functional group including a hydroxy group, a carboxyl group, an amino group, a glycidyl group, or a combination thereof.

A twelfth aspect of the present invention is the method for roughening a surface according to the tenth or eleventh aspect, wherein the organic resin layer (B) has a thickness of 0.001 to 10 μm.

A thirteenth aspect of the present invention is the method for roughening a surface according to any one of the first to ninth aspects, wherein the composition (a3) further contains a crosslinker and a cross-linking catalyst.

A fourteenth aspect of the present invention is the method for roughening a surface according to any one of the tenth to twelfth aspects, wherein one or both of the compositions (a3) and (b3) further contains a crosslinker and a cross-linking catalyst.

A fifteenth aspect of the present invention is the method for roughening a surface according to any one of the first to fourteenth aspects, further comprising a third step of gas-etching the surface of the substrate after the second step.

A sixteenth aspect of the present invention is a method for using a layer formed by the method for roughening a surface according to any one of the first to fifteenth aspects as a light extraction layer of an LED or a low-reflective glass layer of a solar cell.

Effects of the Invention

In an organic EL display, an ITO electrode, a hole injection layer, a hole transport layer, a light-emitting layer, an electron transport layer, an electron injection layer, and an electrode are formed on a substrate such as glass and transparent plastic.

In an LED, an n-type semiconductor, a light-emitting area, a p-type semiconductor, an ITO electrode, and a $SiO_2$ layer are formed on a sapphire substrate.

Various light extraction layers that aims to improve the light extraction efficiency for improvement of the light-emitting efficiency of the organic EL display and the LED, as described above, are investigated.

For a solar cell, improvement of conversion efficiency is investigated. A procedure effective in the improvement includes reduction of reflection of sunlight by a surface.

According to the method for roughening a surface of the present invention, a surface of glass, transparent plastic, or a $SiO_2$ layer that is used as a light extraction layer of the organic EL display, the LED, or the solar cell can be roughened. For example, fine irregularities can be formed. Therefore, the reflection of light by the glass or the like can be reduced. This can lead to improvement of the light-emitting efficiency. The method for roughening a surface of the present invention can be applied to formation of fine irregularities on a reflection-reducing layer of the solar cell.

A method for reducing the reflection of light by a substrate used for the light extraction layer that has been proposed includes a conventional method of attaching inorganic particles and the like to the substrate used for the light extraction layer. This method has a problem involved in adhesion of the inorganic particles and the like to the substrate. In the present invention, a surface of a substrate is physically roughened by etching, unlike the conventional method. For example, irregularities and the like are formed. Therefore, the present invention does not have the problem of the conventional method involved in adhesion of the inorganic particles and the like to the substrate.

Fine irregularities can be also formed by lithography technique or dry etching technique used in roughening a surface of a substrate. However, devices are expensive, and the size to be formed is restricted.

The present invention includes a first step of applying a composition (a3) containing inorganic particles (a1) and an organic resin (a2) to a surface of a substrate to be roughened, and drying and curing the composition to form an organic resin layer (A) on the substrate, and a second step of etching the substrate on which the organic resin layer (A) is formed to roughen the surface of the substrate. In the present invention, a difference in etching rate by a solution between the inorganic particles (a1) and the organic resin (a2) contained in the organic resin layer (A) is used to form irregularities on the organic resin layer (A). At the same time, a portion where the inorganic particles (a1) contained in the organic resin layer (A) exist is selectively etched by a solution, to expose the surface of the substrate. Thus, the substrate such as $SiO_2$ is also etched by the solution to form irregularities. In this case, the organic resin layer (A) (especially, the organic resin (a2)) functions as a mask in etching using the solution.

In the present invention, the formation of the organic resin layer (A) and the etching using the solution allow fine irregularities to be easily formed on the surface of the substrate (allow the surface of the substrate to be roughened).

Roughening of the substrate varies depending on the average particle diameter of the inorganic particles or the concentration (ratio) of the inorganic particles in the organic resin layer (A), and is determined by a necessary roughened surface profile (irregularity profile) on the substrate.

MODES FOR CARRYING OUT THE INVENTION

The present invention relates to a method for roughening a surface of a substrate.

The "roughening" herein means that a surface of a substrate is roughened by etching. The surface of the substrate is modified by a chemical or physical treatment. For example, irregularities are formed on the surface of the substrate.

The present invention is a method for roughening a surface comprising: a first step of applying a composition (a3) containing inorganic particles (a1) and an organic resin (a2) to a surface of a substrate, and drying and curing the composition to form an organic resin layer (A) on the substrate; and a second step of etching the substrate on which the organic resin layer (A) is formed by a solution containing hydrogen fluoride, hydrogen peroxide, or an acid, to roughen the surface of the substrate.

In the second step, the etching is preferably performed by a solution containing hydrogen fluoride and an ammonium salt, a solution containing hydrogen peroxide and ammonia, hydrogen peroxide and sulfuric acid, or a solution containing phosphoric acid and nitric acid.

For example, the solution containing hydrogen fluoride and an ammonium salt can be used as a buffer solution.

In a preferable embodiment, the etching can be performed by a solution containing hydrogen fluoride and ammonium fluoride or a solution containing hydrogen peroxide and ammonia.

As described above, wet etching is performed as the etching in the present invention. The inorganic particles (a1) in the organic resin layer (A) are etched by the solution. In contrast, the organic resin (a2) in the organic resin layer (A) exhibits resistance to etching using the solution. When the etching for the organic resin layer (A) reaches the surface of the substrate, the substrate can subsequently be etched by an acidic aqueous solution. As an acid used in the acidic aqueous solution, hydrofluoric acid, sulfuric acid, nitric acid, hydrochloric acid, phosphoric acid, or buffered hydrofluoric acid is used.

The solution used in the etching in the present invention is an aqueous solution. The solution may further contain an organic solvent.

The organic solvent is an alcohol-based, ether-based, ketone-based, or ester-based solvent. Examples of the organic solvent include ethylene glycol monomethyl ether, ethylene glycol monoethyl ether, methyl cellosolve acetate, ethyl cellosolve acetate, propylene glycol monobutyl ether, propylene glycol monobutyl ether acetate, diethylene glycol monomethyl ether, diethylene glycol monoethyl ether, propylene glycol, propylene glycol monomethyl ether, propylene glycol monomethyl ether acetate, propylene glycol monoethyl ether, propylene glycol monoethyl ether acetate, propylene glycol propyl ether acetate, toluene, xylene, methyl ethyl ketone, cyclopentanone, cyclohexanone, ethyl 2-hydroxypropionate, ethyl 2-hydroxy-2-methylpropionate, ethyl ethoxyacetate, ethyl hydroxyacetate, methyl 2-hydroxy-3-methylbutanoate, methyl 3-methoxypropionate, ethyl 3-methoxypropionate, ethyl 3-ethoxypropionate, methyl 3-ethoxypropionate, methyl pyruvate, ethyl pyruvate, ethyl acetate, butyl acetate, ethyl lactate, butyl lactate, or the like can be used. The organic solvent may be used alone, or two or more kinds thereof may be used in combination.

The concentration of ammonium salt, acid, or ammonia in water or a whole solution including water and the organic solvent that is the solution used in etching is 0.01 to 97% by mass, and the concentration of hydrogen peroxide in the whole solution is 0.001 to 40% by mass or 0.01 to 40% by mass.

For example, in a case of mixed solution of hydrogen peroxide and ammonia, the mixed solution is an aqueous solution in which hydrogen peroxide, ammonia, and water are mixed at a ratio by mass $NH_4OH/H_2O_2/H_2O$ of 1:1:5 to 0.05:1:5.

For example, in a case of mixed solution of hydrogen peroxide and sulfuric acid, the mixed solution is an aqueous solution in which hydrogen peroxide and sulfuric acid are mixed at a ratio by mass $H_2SO_4/H_2O_2$ of 1:1 to 4:1.

For example, in a case of using a mixed aqueous solution of hydrogen fluoride (acid) and an ammonium fluoride solution, an 50% by mass hydrogen fluoride aqueous solution and a 40% by mass ammonium fluoride aqueous solution can be used for a mixed aqueous solution.

As the inorganic particles (a1) used in the present invention, a metallic oxide is used. Examples thereof include silicon oxide (silica), titanium oxide, zirconium oxide, aluminum oxide, silicon nitride, and titanium nitride. In particular, silicon oxide (silica) is preferable. Inorganic particles having an average particle diameter of 5 to 1,000 nm, 5 to 200 nm, or 10 to 50 nm can be used.

It is preferable that the inorganic particles in a colloidal state be added to the organic resin (a2). That is, a sol in which the inorganic particles (a1) are dispersed in the organic solvent is added to the organic resin (a2) or a solution of the organic resin (a2), to obtain the composition (a3). The composition (a3) is used in coating of the substrate, as described later.

A silica sol in which silica is dispersed as the inorganic particles (a1) in the organic solvent, or a titanium oxide sol in which titanium oxide is dispersed in the organic solvent is usually used. The sol and the solution of the organic resin (a2) are mixed, to obtain the composition (a3).

In the present invention, the average particle diameter of fine particles means a value obtained by observation of the fine particles in the sol with an electron microscope.

The composition (a3) and the organic resin layer (A) that is obtained by applying the composition (a3) followed by drying and curing contain the inorganic particles (a1) and the organic resin (a2), and the content of the inorganic particles (a1) is 1 to 100 parts by mass or 5 to 70 parts by mass relative to 100 parts by mass of the organic resin (a2).

The organic resin (a2) is a resin having a repeating unit structure. The repeating unit structure is preferably a structure having as a functional group a polar group including a hydroxy group, a carboxyl group, an amino group, a glycidyl group, or a combination thereof. These functional groups are preferable in terms of compatibility with the inorganic particles and application property to the substrate. These functional groups are preferable in terms of insolubility of a cured film in the acidic aqueous solution.

Examples of a resin having the functional group include an acrylic resin and a novolac resin.

As the organic resin (a2), polyether and polyetherether ketone materials, or an epoxy resin may be used.

Examples of an acrylic resin include a homopolymer of a monomer having a hydroxy group, a carboxyl group, an amino group, or a glycidyl group, and a copolymer of the monomer with another monomer constituting the resin.

Examples of the monomer include (meth)acrylic acid, (meth)acrylate, and a vinyl compound.

Examples of the monomer having a hydroxy group, a carboxyl group, an amino group, or a glycidyl group include monomers such as (meth)acrylic acid, (meth)acrylamide, hydroxyalkyl (meth)acrylate, carboxyalkyl (meth)acrylate, aminoalkyl (meth)acrylate, glycidyl (meth)acrylate, hydroxystyrene, hydroxyvinylnaphthalene, and vinyl benzoate.

Examples of the other monomer constituting the resin include monomers that does not have the functional groups described above. Examples thereof include alkyl (meth)acrylate such as methyl (meth)acrylate and ethyl (meth)acrylate, phenyl (meth)acrylate, benzyl (meth)acrylate, styrene, t-butylstyrene, and vinylnaphthalene.

By radical polymerization or cationic polymerization of the acrylic monomer, the acrylic resin described above is obtained.

Examples of the polyether and polyetherether ketone materials include polyether and polyetherether ketone that are obtained by a reaction of a phenolic hydroxy group-containing compound with a halogen group-containing aromatic compound.

Examples of a novolac resin include a novolac resin obtained by a reaction of a phenolic hydroxy group-containing compound or an amino group-containing aromatic compound with an aldehyde compound, and a novolac resin obtained by a reaction of a phenolic hydroxy group-containing compound or an amino group-containing aromatic compound with an aldehyde compound containing a hydroxy group, a carboxyl group, or an amino group.

Examples of the phenolic hydroxy group-containing compound include monovalent phenols such as phenol, cresol, salicylic acid, and naphthol, divalent phenols such as catechol and resorcinol, trivalent phenols such as pyrogallol and phloroglucinol, and polynuclear phenols such as biphenol, bisphenol A, and bisphenol S.

Examples of the amino group-containing aromatic compound include pyrrole, phenylnaphthylamine, phenylindole, carbazole, diphenylamine, and 3-hydroxydiphenylamine.

Examples of aldehydes include saturated aliphatic aldehydes such as formaldehyde, paraformaldehyde, acetaldehyde, propylaldehyde, butyraldehyde, isobutyraldehyde, valeraldehyde, capronaldehyde, 2-methylbutyraldehyde, 2-ethylhexylaldehyde (2-ethylhexanal), hexylaldehyde, undecanealdehyde, 7-methoxy-3,7-dimethyloctylaldehyde, cyclohexanealdehyde, cyclohexanecarbaldehyde, 3-methyl-2-butyraldehyde, glyoxal, malonaldehyde, malondialdehyde, succinaldehyde, glutaraldehyde, and adipalaldehyde; unsaturated aliphatic aldehydes such as acrolein, and methacrolein; heterocyclic aldehydes such as furfural, and pyridinealdehyde; and aromatic aldehydes such as benzaldehyde, naphthylaldehyde, anthrylaldehyde, phenanthrylaldehyde, salicylaldehyde, phenylacetaldehyde, 3-phenylpropionaldehyde, tolylaldehyde, (N,N-dimethylamino)benzaldehyde, and acetoxybenzaldehyde.

Further, examples thereof include those obtained by bonding a hydroxy group, a carboxyl group, or an amino group to the aldehydes described above.

Among these, an aldehyde compound containing a hydroxy group or a carboxyl group is preferable. Examples thereof include hydroxybenzaldehyde, carboxybenzaldehyde, hydroxynaphthaldehyde, carboxynaphthaldehyde, hydroxypyrenealdehyde, and pyrenecarboxaldehyde.

In the phenolic hydroxy group-containing compound, the amino group-containing aromatic compound, and the aldehyde compound, an aldehyde can be used in an amount of 0.1 to 10 equivalent weights relative to 1 equivalent weight of phenyl group.

As an acid catalyst used in the condensation reaction, for example, a mineral acid such as sulfuric acid, phosphoric acid, and perchloric acid, an organic sulfonic acid such as trifluoromethanesulfonic acid, p-toluenesulfonic acid, and p-toluenesulfonic acid monohydrate, or a carboxylic acid such as formic acid and oxalic acid is used. The amount of acid catalyst to be used is variously selected depending on the kind of used acid. The amount of acid catalyst to be used is usually 0.001 to 10,000 parts by mass, preferably 0.01 to 1,000 parts by mass, and more preferably 0.1 to 100 parts by mass, relative to a total amount of the phenolic hydroxy group-containing compound or the amino group-containing aromatic compound and the aldehyde compound of 100 parts by mass.

The condensation reaction can be carried out without a solvent, but the condensation reaction is usually carried out using a solvent. Any solvent can be used as long as it does not inhibit the reaction. Examples of the solvent include ethers such as butyl cellosolve (2-butoxy ethanol), and cyclic ethers such as tetrahydrofuran and dioxane. For example, when the used acid catalyst is a liquid like formic acid, it can also act as the solvent.

The reaction temperature during condensation is usually 40° C. to 200° C. The reaction time is variously selected depending on the reaction temperature, and is usually about 30 minutes to about 50 hours.

Examples of the organic resin (a2) used in the present invention may include resins having repeating unit structures of the following formulae (1-1) to (1-8).

Formula (1-1)

Formula (1-2)

Formula (1-3)

Formula (1-4)

Formula (1-5)

Formula (1-6)

-continued

Formula (1-7)

Formula (1-8)

In addition to the acrylic resin and the novolac resin, an epoxy resin may be used in the present invention.

Examples of the epoxy resin include polyfunctional epoxy compounds. For example, ε-caprolactone modified tetra(3,4-epoxycyclohexylmethyl)butanetetracarboxylate (product name EPOLEAD GT401 available from Daicel Corporation, alicyclic epoxy) or the like may be used.

The organic resin (a2) used in the present invention has a weight average molecular weight (Mw) measured by gel permeation chromatography (GPC) in terms of polystyrene of 600 to 1,000,000 or 600 to 200,000.

The composition (a3) used in the present invention contains the organic resin (a2), the inorganic particles (a1), and the solvent. The composition (a3) may contain an additive such as a surfactant described later, if necessary.

The solid content in the composition (a3) may be 0.1 to 70% by mass or 0.1 to 60% by mass, relative to the total amount of the composition (a3). The solid content means all the components constituting the composition (a3) except for the solvent. The organic resin (a2) may be contained in an amount of 1 to 99.9% by mass or 20 to 99.9% by mass, relative to the total amount of the solid content.

As described above, the method for roughening a surface of the present invention includes the first step of applying the composition (a3) containing the inorganic particles (a1) and the organic resin (a2) to a surface of the substrate, and drying and curing the composition to form the organic resin layer (A) on the substrate, and the second step of etching the substrate on which the organic resin layer (A) formed by the solution containing hydrogen fluoride, hydrogen peroxide, or an acid, to roughen the surface of the substrate. Further, after the second step, the method for roughening a surface may include a third step of gas etching the surface of the substrate.

In the present invention, the organic resin layer (A) is formed on the substrate, and the substrate is etched (wet etched, or wet etched and gas etched) from the top of the substrate, to roughen the surface of the substrate.

In the method for roughening a surface of the present invention, the first step may further include a pre-first step of applying a composition (b3) containing an organic resin (b2) to the surface of the substrate, and drying and curing the composition to form an organic resin layer (B) on the substrate before formation of the organic resin layer (A).

In this embodiment of the present invention, the organic resin layer (B) is formed on the substrate, the organic resin layer (A) is then formed on the organic resin layer (B), and the substrate is etched (wet etched, or wet etched and gas etched), to roughen the surface of the substrate.

When the pre-first step is further included, the organic resin (b2) contained in the organic resin layer (B) can be selected from the same kind of resins as the organic resin (a2) of the organic resin layer (A), that is, from the organic resin (a2) that is a resin having a repeating unit structure, the repeating unit structure being a structure having a functional group including a hydroxy group, a carboxyl group, an amino group, a glycidyl group, or a combination thereof. Further, as the organic resin (b2) and the organic resin (a2), the same resin may be used.

The composition (b3) used in the present invention contains the organic resin (b2) and a solvent. The composition (b3) may contain an additive such as a surfactant described later, if necessary.

The solid content in the composition (b3) may be 0.1 to 70% by mass or 0.1 to 60% by mass, relative to the total amount of the composition (b3). The solid content means all the components constituting the composition (b3) except for the solvent. The organic resin (b2) may be contained in an amount of 1 to 100% by mass, 1 to 99.9% by mass, or 50 to 99.9% by mass, relative to the total amount of the solid content.

The organic resin (b2) used in the present invention has a weight average molecular weight (Mw) measured by gel permeation chromatography (GPC) in terms of polystyrene of 600 to 1,000,000 or 600 to 200,000.

The organic resin layer (B) is obtained by applying the composition (b3) to the substrate, followed by drying and curing, and the composition (a3) to form the organic resin layer (A) on an upper layer of the organic resin layer (B) is further applied. Therefore, in order to prevent intermixing (mixing of layers), the composition (b3) may further contain a crosslinker and a cross-linking catalyst.

The composition (a3) forming the organic resin layer (A) may also contain the crosslinker and the cross-linking catalyst, if necessary.

Examples of the crosslinker used for the compositions (a3) and (b3) include melamine-based crosslinkers, substituted urea-based crosslinkers, and polymers thereof. A crosslinker having at least two crosslinking-forming substituents is preferable. Examples thereof include compounds such as methoxymethylated glycoluril, butoxymethylated glycoluril, methoxymethylated melamine, butoxymethylated melamine, methoxymethylated benzoguanamine, butoxymethylated benzoguanamine, methoxymethylated urea, butoxymethylated urea, methoxymethylated thiourea, and methoxymethylated thiourea. A condensate of the compounds may be also used.

The amount of crosslinker to be added varies depending on a coating solvent to be used, an underlying substrate to be used, a solution viscosity to be required, and a film form to be required. The amount of crosslinker to be added is 0.001 to 80% by mass, preferably 0.01 to 50% by mass, and further preferably 0.05 to 40% by mass, relative to the total amount of whole solid content of the composition (a3) or (b3).

In the present invention, as a catalyst (cross-linking catalyst) for promoting the cross-linking reaction, an acidic compound such as p-toluenesulfonic acid, trifluoromethanesulfonic acid, pyridinium p-toluenesulfonic acid, salicylic acid, sulfosalicylic acid, citric acid, benzoic acid, hydroxybenzoic acid, and naphthalenecarboxylic acid, and/or a thermal acid generator such as 2,4,4,6-tetrabromocyclohexadienone, benzoin tosylate, 2-nitrobenzyl tosylate, and other organic sulfonic acid alkyl ester may be mixed.

The amount of cross-linking catalyst to be mixed is 0.0001 to 20% by mass, preferably 0.0005 to 10% by mass, and preferably 0.01 to 3% by mass, relative to the total amount of whole solid content of the composition (a3) or (b3).

In the present invention, examples of surfactant usable for the composition (a3) or (b3) include nonionic surfactants including polyoxyethylene alkyl ethers such as polyoxyethylene lauryl ether, polyoxyethylene stearyl ether, polyoxyethylene cetyl ether, and polyoxyethylene oleyl ether; polyoxyethylene alkylaryl ethers such as polyoxyethylene octylphenol ether and polyoxyethylene nonylphenol ether; polyoxyethylene-polyoxypropylene block copolymers; sorbitan fatty acid esters, such as sorbitan monolaurate, sorbitan monopalmitate, sorbitan monostearate, sorbitan monooleate, sorbitan trioleate, and sorbitan tristearate; and polyoxyethylene sorbitan fatty acid esters such as polyoxyethylene sorbitan monolaurate, polyoxyethylene sorbitan monopalmitate, polyoxyethylene sorbitan monostearate, polyoxyethylene sorbitan trioleate, and polyoxyethylene sorbitan tristearate; fluorosurfactants including F Top EF301, EF303, and EF352 (trade name, available from Tohkem products Corporation (currently, Mitsubishi Materials Electronic Chemicals Co., Ltd.)), MEGAFACE F171, F173, and R-40 (trade name, available from DIC Corporation), Fluorad FC430 and FC431 (trade name, available from Sumitomo 3M, Ltd.), and AsahiGuard AG710, and Surflon S-382, SC101, SC102, SC103, SC104, SC105, and SC106 (trade name, available from Asahi Glass Co., Ltd.), and organosiloxane polymer KP341 (available from Shin-Etsu Chemical Co., Ltd.).

The amount of surfactant to be mixed is usually 2.0% by mass or less, and preferably 1.0% by mass or less, relative to the total amount of whole solid content of the composition (a3) or (b3). The surfactant may be added alone, or two or more kinds thereof may be added in combination.

In the present invention, examples of a solvent usable for the composition (a3) or (b3) include ethylene glycol monomethyl ether, ethylene glycol monoethyl ether, methyl cellosolve acetate, ethyl cellosolve acetate, diethylene glycol monomethyl ether, diethylene glycol monoethyl ether, propylene glycol, propylene glycol monomethyl ether, propylene glycol monomethyl ether acetate, propylene glycol monoethyl ether, propylene glycol monoethyl ether acetate, propylene glycol propyl ether acetate, toluene, xylene, methyl ethyl ketone, methyl isobutyl ketone, cyclopentanone, cyclohexanone, ethyl 2-hydroxypropionate, ethyl 2-hydroxy-2-methylpropionate, ethyl ethoxyacetate, ethyl hydroxyacetate, methyl 2-hydroxy-3-methylbutanoate, methyl 3-methoxypropionate, ethyl 3-methoxypropionate, ethyl 3-ethoxypropionate, methyl 3-ethoxypropionate, methyl pyruvate, ethyl pyruvate, ethyl acetate, butyl acetate, ethyl lactate, and butyl lactate. The organic solvent may be used alone, or two or more kinds thereof can be used in combination.

Further, a mixture of solvents having a high boiling point such as propylene glycol monobutyl ether and propylene glycol monobutyl ether acetate can be used. Among the solvents, propylene glycol monomethyl ether, propylene glycol monomethyl ether acetate, ethyl lactate, butyl lactate, and cyclohexanone are preferable in terms of improved leveling properties.

Next, the method for roughening a surface of the present invention will be described.

The composition (a3) is applied to a surface of a substrate or a base material by an appropriate coating method using a spinner, a coater, or the like, and then baked (dried) and cured, to form the organic resin layer (A) on the substrate (first step). If the organic resin layer (B) is contained, the composition (b3) is applied to a surface of a substrate or a base material by an appropriate coating method using a spinner, a coater, or the like, and then baked (dried) and cured, to form the organic resin layer (B) on the substrate (pre-first step). Subsequently, the organic resin layer (A) is formed on the organic resin layer (B) by the procedure described above.

In the present invention, it is preferable that the organic resin layer (A) be a layer having a thickness of 0.001 to 10 μm or 0.005 to 3.0 μm. It is preferable that the organic resin layer (B) be a layer having a thickness of 0.001 to 10 μm or 0.005 to 3.0 μm.

The organic resin layer (A) is a layer that contributes to roughening the surface of the substrate by etching described later. Therefore, the organic resin layer (A) herein is also referred to as "roughened-surface forming layer."

A baking condition after application of the composition (a3) or (b3) is at 80 to 400° C. for 0.5 to 120 minutes.

After the composition (a3) is applied to the substrate and cured under the baking condition to form the organic resin layer (A), the substrate on which the organic resin layer (A) formed is etched from the top of the substrate by the above mentioned solution, to roughen the surface of the substrate (second step). By the wet etching, only a portion where the inorganic particles (a1) exist in the organic resin layer (A) is scraped off in a perpendicular direction. When the etching reaches the surface of the substrate, the substrate can subsequently be etched by the solution. As a result, the substrate can be roughened to form irregularities.

The aforementioned substrate includes not only the substrate itself but also a coating-substrate in which the substrate is coated with $SiO_2$ or the like. According to the method of the present invention, the surface of the substrate or the surface of coating-substrate can be roughened.

The etching by the solution (second step) is performed until holes having an aspect ratio (height/diameter) of 0.1 to 20 or 0.1 to 10 are formed on the surface of the substrate by the etching. The etching time is usually about 1 second to 1 hour or about 5 seconds to 10 minutes. Examples of the substrate include silicon, silicon oxide, glass, and sapphire.

In the present invention, not only wet etching but also a combination of gas etching (dry etching) and wet etching may be performed.

For example, the substrate is coated with the organic resin layer (B), and the organic resin layer (B) is coated with the organic resin layer (A). The organic resin layer (A) is wet etched by using the solution described above, and the organic resin layer (B) is then gas etched. Thus, the substrate is processed. In the gas etching, gas such as tetrafluoromethane ($CF_4$), perfluorocyclobutane ($C_4F_8$), perfluoropropane ($C_3F_8$), trifluoromethane ($CHF_3$), difluoromethane ($CH_2F_2$), carbon monoxide, argon, oxygen, nitrogen, sulfur hexafluoride, nitrogen trifluoride, or chlorine trifluoride, chlorine, trichloroborane, or dichloroborane can be used.

The layer formed by the method for roughening a surface of the present invention can be suitably used as a light extraction layer of an LED or a low-reflective glass layer of a solar cell.

EXAMPLES

Hereinafter, the present invention will be described further in detail by Examples. However, the present invention is not limited to Examples.

Synthesis Example 1

30 g of 2-vinylnaphthalene, 3.5 g of glycidyl methacrylate, and 4.5 g of 1-butoxyethyl methacrylate were dissolved in 112 g of cyclohexanone in a flask, the inside of the flask was replaced with nitrogen, and the temperature was increased to 60° C. After the temperature reached 60° C., 1.9 g of azobisisobutyronitrile dissolved in 48 g of cyclohexanone was added under a nitrogen pressurized atmosphere, to cause a reaction at 60° C. for 24 hours. The reaction solution was cooled, and then added to methanol, to reprecipitate a polymer. The polymer was dried by heating, to obtain a polymer having a repeating unit structure of Formula (1-1) described above. The obtained polymer had a weight average molecular weight Mw of 6,000 (in terms of polystyrene). In Formula (1-1), the ratio of the number of repeating unit structure derived from 2-vinylnaphthalene to the total number of repeating unit structures constituting the polymer was 0.8, the ratio of the number of repeating unit structure derived from glycidyl methacrylate to the total number of repeating unit structures constituting the polymer was 0.1, and the ratio of the number of repeating unit structure derived from 1-butoxyethyl methacrylate to the total number of repeating unit structures constituting the polymer was 0.1, if the total number of repeating unit structures constituting the polymer is regarded as 1.0.

Synthesis Example 2

In a 100-mL eggplant-shaped flask, 6.7 g of diphenylamine (available from Tokyo Chemical Industry Co., Ltd.), 7.3 g of 3-hydroxydiphenylamine (available from Tokyo Chemical Industry Co., Ltd.), 10.2 g of 2-ethylhexanal (available from Tokyo Chemical Industry Co., Ltd.), 0.8 g of trifluoromethanesulfonic acid (available from Tokyo Chemical Industry Co., Ltd.), and 25.0 g of 2-butoxyethanol (available from Kanto Chemical Co., Inc.) were placed. Subsequently, the inside of the flask was replaced with nitrogen, and the mixture was heated, and stirred at 150° C. (in a reflux state) for about 1 hour with refluxing. After completion of the reaction, the reactant was diluted with tetrahydrofuran (available from Kanto Chemical Co., Inc.) to 35% by mass. The diluted solution was added dropwise to 2,000 mL of methanol/ammonia aqueous solution (methanol/water/ammonia=24/24/1) (by volume), resulting in reprecipitation. The obtained precipitate was filtered with suction, the residue was washed with the methanol/ammonia aqueous solution (methanol/water/ammonia=24/24/1) (by volume), and dried at 70° C. under reduced pressure overnight, to obtain 23.0 g of novolac resin. The obtained polymer corresponded to a polymer having a repeating unit structure of Formula (1-8). The weight average molecular weight Mw measured by GPC in terms of polystyrene was 10,000.

Preparation Example 1 of Surface-Roughening Material Corresponding to Composition (a3)

0.6 g of the resin obtained in Synthesis Example 1 was added to 0.02 g of organosilicasol liquid ([trade name] MIBK-ST available from NISSAN CHEMICAL INDUS- TRIES, LTD., dispersion medium: methyl isobutyl ketone, silica concentration: 30% by mass, average particle diameter: 10 to 15 nm), 35.04 g of cyclohexanone, and 14.97 g of propylene glycol monomethyl ether acetate, to obtain a solution. Subsequently, the solution was filtered through a polyethylene microfilter having a pore diameter of 0.2 μm, to prepare a solution of a composition (a3-1).

Preparation Example 2 of Surface-Roughening Material Corresponding to Composition (a3)

0.6 g of the resin obtained in Synthesis Example 1 was added to 0.02 g of organosilicasol liquid ([trade name] MIBK-ST-L available from NISSAN CHEMICAL INDUSTRIES, LTD., dispersion medium: methyl isobutyl ketone, silica concentration: 30% by mass, average particle diameter: 40 to 50 nm), 24.61 g of cyclohexanone, and 10.51 g of propylene glycol monomethyl ether acetate, to obtain a solution. Subsequently, the solution was filtered through a polyethylene microfilter having a pore diameter of 0.2 to prepare a solution of a composition (a3-2).

Preparation Example 3 of Surface-Roughening Material Corresponding to Composition (a3)

0.6 g of the resin obtained in Synthesis Example 1 was added to 0.02 g of organosilicasol liquid ([trade name] MIBK-ST-ZL available from NISSAN CHEMICAL INDUSTRIES, LTD., dispersion medium: methyl isobutyl ketone, silica concentration: 30% by mass, average particle diameter: 70 to 100 nm), 16.60 g of cyclohexanone, and 7.09 g of propylene glycol monomethyl ether acetate, to obtain a solution. Subsequently, the solution was filtered through a polyethylene microfilter having a pore diameter of 0.2 μm, to prepare a solution of a composition (a3-3).

Preparation Example 4 of Surface-Roughening Material Corresponding to Composition (a3)

0.3 g of the resin obtained in Synthesis Example 1 was added to 0.05 g of organosilicasol liquid ([trade name] MIBK-ST available from NISSAN CHEMICAL INDUSTRIES, LTD., dispersion medium: methyl isobutyl ketone, silica concentration: 30% by mass, average particle diameter: 10 to 15 nm), 18.22 g of cyclohexanone, and 7.77 g of propylene glycol monomethyl ether acetate, to obtain a solution. Subsequently, the solution was filtered through a polyethylene microfilter having a pore diameter of 0.2 μm, to prepare a solution of a composition (a3-4).

Preparation Example 5 of Surface-Roughening Material Corresponding to Composition (a3)

0.6 g of the resin obtained in Synthesis Example 1 was added to 0.1 g of organosilicasol liquid ([trade name] MIBK-ST-L available from NISSAN CHEMICAL INDUSTRIES, LTD., dispersion medium: methyl isobutyl ketone, silica concentration: 30% by mass, average particle diameter: 40 to 50 nm), 29.06 g of cyclohexanone, and 12.37 g of propylene glycol monomethyl ether acetate, to obtain a solution. Subsequently, the solution was filtered through a polyethylene microfilter having a pore diameter of 0.2 μm, to prepare a solution of a composition (a3-5).

Preparation Example 6 of Surface-Roughening Material Corresponding to Composition (a3)

0.3 g of the resin obtained in Synthesis Example 1 was added to 0.1 g of organosilicasol liquid ([trade name] MIBK-ST-L available from NISSAN CHEMICAL INDUSTRIES, LTD., dispersion medium: methyl isobutyl ketone, silica concentration: 30% by mass, average particle diameter: 40 to 50 nm), 25.52 g of cyclohexanone, and 10.87 g of propylene glycol monomethyl ether acetate, to obtain a solution. Subsequently, the solution was filtered through a polyethylene microfilter having a pore diameter of 0.2 μm, to prepare a solution of a composition (a3-6).

Preparation Example 7 of Surface-Roughening Material Corresponding to Composition (a3)

0.3 g of the resin obtained in Synthesis Example 1 was added to 0.05 g of organosilicasol liquid ([trade name] PGM-ST available from NISSAN CHEMICAL INDUSTRIES, LTD., dispersion medium: propylene glycol monomethyl ether, silica concentration: 30% by mass, average particle diameter: 10 to 15 nm), 18.22 g of cyclohexanone, and 7.78 g of propylene glycol monomethyl ether acetate, to obtain a solution. Subsequently, the solution was filtered through a polyethylene microfilter having a pore diameter of 0.2 μm, to prepare a solution of a composition (a3-7).

Preparation Example 8 of Surface-Roughening Material Corresponding to Composition (a3)

0.3 g of EPOLEAD GT401 (trade name, available from Daicel Corporation) was added as the organic resin (a2) to 0.5 g of organosilicasol liquid ([trade name] MIBK-ST available from NISSAN CHEMICAL INDUSTRIES, LTD., dispersion medium: methyl isobutyl ketone, silica concentration: 30% by mass, average particle diameter: 10 to 15 nm), 48.78 g of propylene glycol monomethyl ether acetate, and 0.1 g of propylene glycol monomethyl ether to obtain a solution. Subsequently, the solution was filtered through a polyethylene microfilter having a pore diameter of 0.2 μm, to prepare a solution of a composition (a3-8).

Preparation Example 9 of Surface-Roughening Material Corresponding to Composition (a3)

0.30 g of the resin obtained in Synthesis Example 2 was added to 0.15 g of SANCOLLOID liquid ([trade name] HT-R305M7-20 available from NISSAN CHEMICAL INDUSTRIES, LTD., titanium oxide sol, dispersion medium: methanol, titanium oxide concentration: 30% by mass, average particle diameter: 20 to 25 nm), and 16.26 g of propylene glycol monomethyl ether, to obtain a solution. Subsequently, the solution was filtered through a polyethylene microfilter having a pore diameter of 0.2 μm, to prepare a solution of a composition (a3-9).

Comparative Preparation Example 1

0.6 g of the resin obtained in Synthesis Example 1 was added to 29.06 g of cyclohexanone and 12.37 g of propylene glycol monomethyl ether acetate, to obtain a solution. Subsequently, the solution was filtered through a polyethylene microfilter having a pore diameter of 0.2 μm, to prepare a solution of a composition (a3-10).

Formation of Roughened-Surface Forming Layer

Example 1

The solution of the composition (a3-1) obtained in Preparation Example 1 of Surface-Roughening Material was applied to a TEOS substrate (SiO$_2$ film-coating silicon wafer) by a spin coater, and baked at 240° C. for 1 minute, to form an organic resin layer A with a thickness of 15 nm (roughened-surface forming layer).

Example 2

The solution of the composition (a3-2) obtained in Preparation Example 2 of Surface-Roughening Material was applied to a TEOS substrate (SiO$_2$ film-coating silicon wafer) by a spin coater, and baked at 240° C. for 1 minute, to form an organic resin layer A with a thickness of 40 nm (roughened-surface forming layer).

Example 3

The solution of the composition (a3-3) obtained in Preparation Example 3 of Surface-Roughening Material was applied to a TEOS substrate (SiO$_2$ film-coating silicon wafer) by a spin coater, and baked at 240° C. for 1 minute, to form an organic resin layer A with a thickness of 90 nm (roughened-surface forming layer).

Example 4

The solution of the composition (a3-4) obtained in Preparation Example 4 of Surface-Roughening Material was applied to a TEOS substrate (SiO$_2$ film-coating silicon wafer) by a spin coater, and baked at 240° C. for 1 minute, to form an organic resin layer A with a thickness of 15 nm (roughened-surface forming layer).

Example 5

The solution of the composition (a3-5) obtained in Preparation Example 5 of Surface-Roughening Material was applied to a TEOS substrate (SiO$_2$ film-coating silicon wafer) by a spin coater, and baked at 240° C. for 1 minute, to form an organic resin layer A with a thickness of 40 nm (roughened-surface forming layer).

Example 6

The solution of the composition (a3-6) obtained in Preparation Example 6 of Surface-Roughening Material was applied to a TEOS substrate (SiO$_2$ film-coating silicon wafer) by a spin coater, and baked at 240° C. for 1 minute, to form an organic resin layer A with a thickness of 40 nm (roughened-surface forming layer).

Example 7

The solution of the composition (a3-7) obtained in Preparation Example 7 of Surface-Roughening Material was applied to a TEOS substrate (SiO$_2$ film-coating silicon wafer) by a spin coater, and baked at 240° C. for 1 minute, to form an organic resin layer A with a thickness of 15 nm (roughened-surface forming layer).

Example 8

The solution of the composition (a3-5) obtained in Preparation Example 5 of Surface-Roughening Material was applied to a TEOS substrate (SiO$_2$ film-coating silicon wafer) by a spin coater, and baked at 240° C. for 1 minute, to form an organic resin layer A with a thickness of 40 nm (roughened-surface forming layer).

Example 9

The solution of the composition (a3-8) obtained in Preparation Example 8 of Surface-Roughening Material was applied to a TEOS substrate (SiO$_2$ film-coating silicon wafer) by a spin coater, and baked at 240° C. for 1 minute, to form an organic resin layer A with a thickness of 15 nm (roughened-surface forming layer).

Example 10

The solution of the composition (a3-9) obtained in Preparation Example 9 of Surface-Roughening Material was applied to a TiN substrate by a spin coater, and baked at 300° C. for 1 minute, to form an organic resin layer A with a thickness of 15 nm (roughened-surface forming layer).

Comparative Example 1

The solution of the composition (a3-10) obtained in Comparative Preparation Example 1 was applied to a TEOS substrate (SiO$_2$ film-coating silicon wafer) by a spin coater, and baked at 240° C. for 1 minute, to form an organic resin layer A with a thickness of 40 nm (roughened-surface forming layer).

(Evaluation of Surface Roughening)

A wafer having the organic resin layer A (roughened-surface forming layer) obtained in each of Examples 1 to 9 was etched by LAL1400 (trade name, available from STELLA CHEMIFA CORPORATION, a mixed aqueous solution of hydrofluoric acid and ammonium fluoride solution). In the etching, LAL1400 was placed in a beaker, and the wafer was immersed in LAL1400. The etching time was 15 to 240 seconds. Subsequently, ashing was carried out by using O$_2$ gas by RIE-10NR (manufactured by SAMCO INC.), to remove an organic substance remaining on the wafer.

A wafer having the organic resin layer A (roughened-surface forming layer) obtained in Example 10 was etched by an aqueous solution containing ammonia and hydrogen peroxide at a ratio ammonia/hydrogen peroxide/water of 25/100/500. In the etching, the solution was placed in a beaker, the beaker was placed in a hot water bath, and the temperature was warmed to 50° C. The wafer was then immersed in the solution. The etching time was 60 seconds. Subsequently, ashing was carried out by using O$_2$ gas by RIE-10NR (manufactured by SAMCO INC.), to remove an organic substance remaining on the wafer.

For the organic resin layer (roughened-surface forming layer) obtained in Comparative Example 1, etching and ashing were carried out in the same manner as etching and ashing in Examples 1 to 9.

Figure 1:
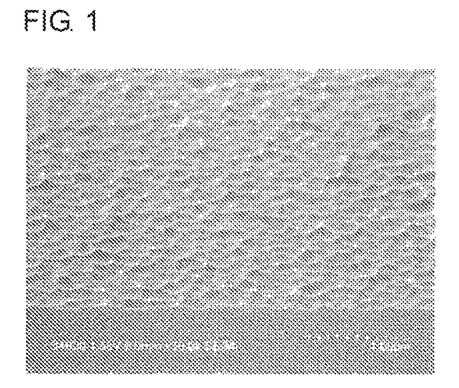
FIG. 1 is a cross-sectional view of roughened surface pattern on a $SiO_2$ film-coating silicon wafer including a roughened-surface forming layer obtained in Example 1 (magnification: 30,000, with tilt).
Figure 2:
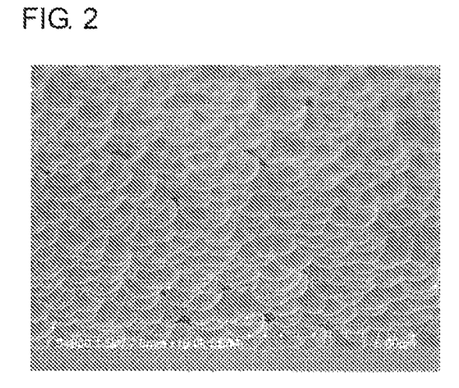
FIG. 2 is a cross-sectional view of roughened surface pattern on a $SiO_2$ film-coating silicon wafer including a roughened-surface forming layer obtained in Example 2 (magnification: 10,000, with tilt).
Figure 3:
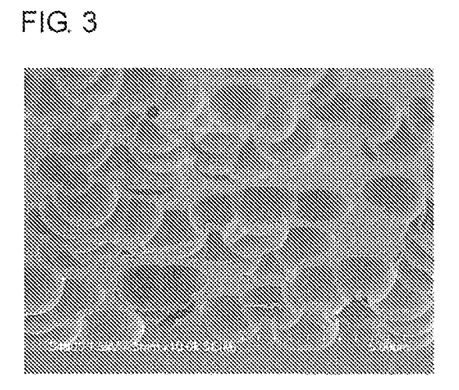
FIG. 3 is a cross-sectional view of roughened surface pattern on a $SiO_2$ film-coating silicon wafer including a roughened-surface forming layer obtained in Example 3 (magnification: 5,000, with tilt).
Figure 4:
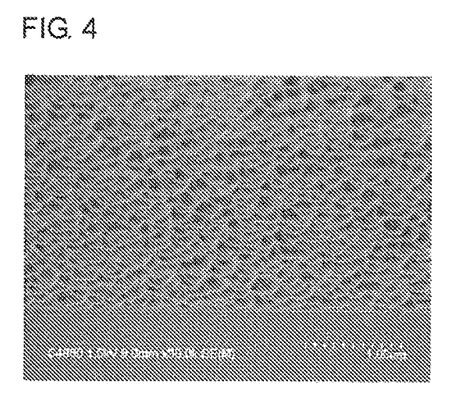
FIG. 4 is a cross-sectional view of roughened surface pattern on a $SiO_2$ film-coating silicon wafer including a roughened-surface forming layer obtained in Example 4 (magnification: 30,000, with tilt).
Figure 5:
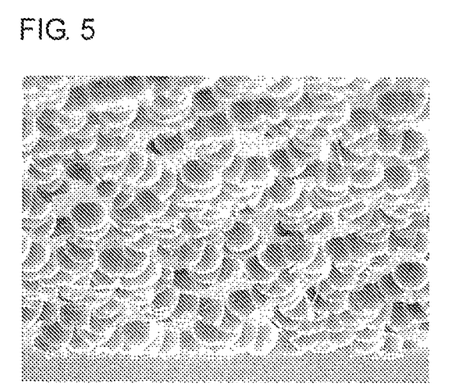
FIG. 5 is a cross-sectional view of roughened surface pattern on a $SiO_2$ film-coating silicon wafer including a roughened-surface forming layer obtained in Example 5 (magnification: 10,000, with tilt).
Figure 6:
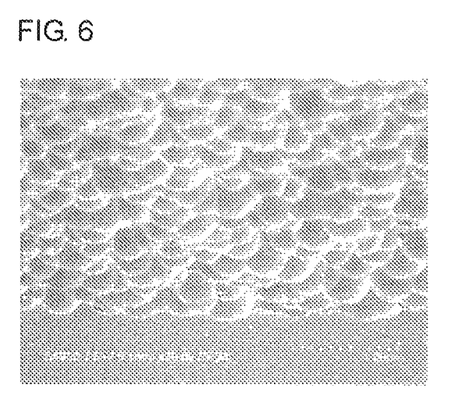
FIG. 6 is a cross-sectional view of roughened surface pattern on a $SiO_2$ film-coating silicon wafer including a roughened-surface forming layer obtained in Example 6 (magnification: 30,000, with tilt).
Figure 7:
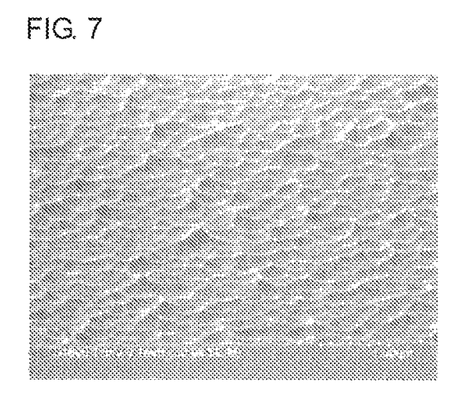
FIG. 7 is a cross-sectional view of roughened surface pattern on a $SiO_2$ film-coating silicon wafer including a roughened-surface forming layer obtained in Example 7 (magnification: 30,000, with tilt).
Figure 8:
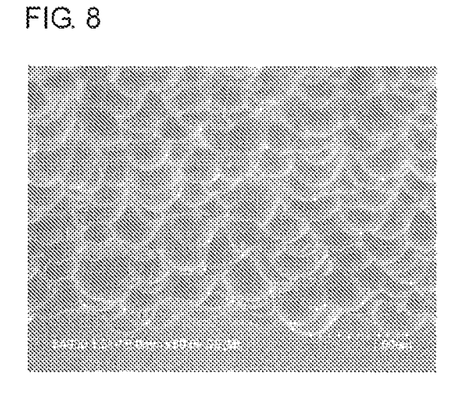
FIG. 8 is a cross-sectional view of roughened surface pattern on a $SiO_2$ film-coating silicon wafer including a roughened-surface forming layer obtained in Example 8 (magnification: 30,000, with tilt).
Figure 9:
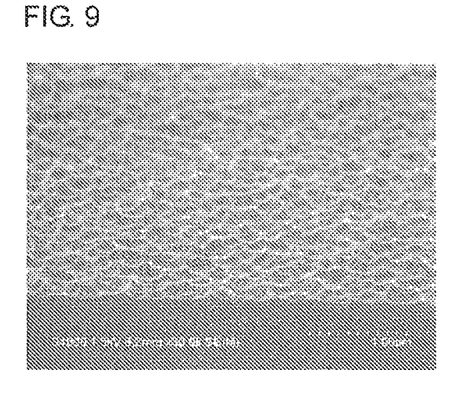
FIG. 9 is a cross-sectional view of roughened surface pattern on a $SiO_2$ film-coating silicon wafer including a roughened-surface forming layer obtained in Example 9 (magnification: 30,000, with tilt).

A surface of the wafer having a roughened surface that was obtained by etching and ashing of the wafer having the roughened-surface forming layer obtained in each of Examples 1 to 9 was observed with a scanning electron microscope (Hitachi S-4800). The surface-roughening pattern profiles of the surfaces of the wafers were observed (see FIGS. 1 to 9).

TABLE 1

Observation of Profile of Roughened-Surface Forming Layer

| | Etching time | Presence or absence of roughening pattern |
|---|---|---|
| Wafer having a roughened surface obtained in Example 1 | 15 seconds | Presence |
| Wafer having a roughened surface obtained in Example 2 | 180 seconds | Presence |
| Wafer having a roughened surface obtained in Example 3 | 240 seconds | Presence |
| Wafer having a roughened surface obtained in Example 4 | 15 seconds | Presence |
| Wafer having a roughened surface obtained in Example 5 | 180 seconds | Presence |
| Wafer having a roughened surface obtained in Example 6 | 60 seconds | Presence |
| Wafer having a roughened surface obtained in Example 7 | 25 seconds | Presence |
| Wafer having a roughened surface obtained in Example 8 | 75 seconds | Presence |
| Wafer having a roughened surface obtained in Example 9 | 15 seconds | Presence |
| Wafer having a roughened surface obtained in Example 10 | 60 seconds | Presence |
| Wafer having a roughened surface obtained in Comparative Example 1 | 60 seconds | Absence |

INDUSTRIAL APPLICABILITY

The present invention provides a method for roughening a surface of a substrate. Specifically, a difference in etching rate by a solution between an inorganic substance and an organic substance is used to form a layer where the inorganic substance and the organic substance are mixed, on a substrate. More specifically, a roughened-surface forming layer including a portion to be etched by the solution and a portion not to be etched by the solution is formed on the surface of the substrate. Subsequently, a portion where the inorganic substance exists is etched by the solution, to expose the surface of the substrate. At the same time, the surface of the $SiO_2$-coating substrate is roughened by etching by the solution. For example, fine irregularities can be formed on the substrate. This configuration can be used to apply the method for roughening a surface of the present invention to formation of a light extraction layer of an LED or the like or a low-reflective layer of a solar cell.

The invention claimed is:

1. A method for roughening a surface comprising:
a first step of applying a composition (a3) containing a sol in which inorganic particles (a1) are dispersed in an organic solvent and an organic resin (a2) to a surface of a substrate, and drying and curing the composition to form an organic resin layer (A) on the substrate; and
a second step of etching the substrate on which the organic resin layer (A) is formed by a solution containing hydrogen fluoride, hydrogen peroxide, or an acid, to roughen the surface of the substrate, wherein during the etching, the inorganic particles (a1) are also etched.

2. The method for roughening a surface according to claim 1, wherein the etching is performed by using a solution containing hydrogen fluoride and an ammonium salt, hydrogen peroxide and ammonia, hydrogen peroxide and sulfuric acid, or phosphoric acid and nitric acid.

3. The method for roughening a surface according to claim 1, wherein the etching is performed by using a solution containing hydrogen fluoride and ammonium fluoride or hydrogen peroxide and ammonia.

4. The method for roughening a surface according to claim 1, wherein the inorganic particles (a1) are metal oxide particles having an average particle diameter of 5 to 1,000 nm.

5. The method for roughening a surface according to claim 1, wherein the composition (a3) is a mixture of silica sol in which silica is dispersed as the inorganic particles (a1) in the organic solvent or titanium oxide sol in which titanium oxide is dispersed as the inorganic particles (a1) in the organic solvent with a solution of the organic resin (a2).

6. The method for roughening a surface according to claim 1, wherein the organic resin layer (A) contains the inorganic particles (a1) and the organic resin (a2) at a ratio of the inorganic particles (a1) to the organic resin (a2) of 5 to 70 parts by mass to 100 parts by mass.

7. The method for roughening a surface according to claim 1, wherein the organic resin (a2) is a resin having a repeating unit structure, the repeating unit structure being a structure having a functional group including a hydroxy group, a carboxyl group, an amino group, a glycidyl group, or a combination thereof.

8. The method for roughening a surface according to claim 1, wherein the second step is a step of forming holes having an aspect ratio (height/diameter) of 0.1 to 20 on the surface of the substrate by etching.

9. The method for roughening a surface according to claim 1, wherein the organic resin layer (A) has a thickness of 0.001 to 10 μm.

10. The method for roughening a surface according to claim 1, wherein the first step further includes a pre-first step of applying a composition (b3) containing an organic resin (b2) to the surface of the substrate, and drying and curing the composition to form an organic resin layer (B) on the substrate before formation of the organic resin layer (A).

11. The method for roughening a surface according to claim 10, wherein the organic resin (b2) is selected from the organic resin (a2) that is a resin having a repeating unit structure, the repeating unit structure being a structure having a functional group including a hydroxy group, a carboxyl group, an amino group, a glycidyl group, or a combination thereof.

12. The method for roughening a surface according to claim 10, wherein the organic resin layer (B) has a thickness of 0.001 to 10 μm.

13. The method for roughening a surface according to claim 10, wherein one or both of the compositions (a3) and (b3) further contains a crosslinker and a cross-linking catalyst.

14. The method for roughening a surface according to claim 1, wherein the composition (a3) further contains a crosslinker and a cross-linking catalyst.

15. The method for roughening a surface according to claim 1, further comprising a third step of gas-etching the surface of the substrate after the second step.

16. A method for using a layer formed by the method for roughening a surface according to claim 1 as a light extraction layer of an LED or a low-reflective glass layer of a solar cell.

* * * * *